United States Patent
Nishikubo et al.

(10) Patent No.: US 10,177,079 B2
(45) Date of Patent: Jan. 8, 2019

(54) CONDUCTIVE CONNECTING MEMBER AND MANUFACTURING METHOD OF SAME

(75) Inventors: Hideo Nishikubo, Tokyo (JP); Shunji Masumori, Tokyo (JP); Takuya Harada, Tokyo (JP); Tomohiro Ishii, Tokyo (JP); Hidemichi Fujiwara, Tokyo (JP)

(73) Assignee: FURUKAWA ELECTRIC CO., LTD., Tokyo (JP)

( * ) Notice: Subject to any disclaimer, the term of this patent is extended or adjusted under 35 U.S.C. 154(b) by 850 days.

(21) Appl. No.: 13/634,079

(22) PCT Filed: Mar. 18, 2011

(86) PCT No.: PCT/JP2011/001642
§ 371 (c)(1),
(2), (4) Date: Sep. 11, 2012

(87) PCT Pub. No.: WO2011/114751
PCT Pub. Date: Sep. 22, 2011

(65) Prior Publication Data
US 2013/0001775 A1 Jan. 3, 2013

(30) Foreign Application Priority Data
Mar. 19, 2010 (JP) ................. 2010-063436

(51) Int. Cl.
*H01L 21/60* (2006.01)
*H05K 13/04* (2006.01)
(Continued)

(52) U.S. Cl.
CPC ...... *H01L 23/4924* (2013.01); *H01L 21/4853* (2013.01); *H01L 24/13* (2013.01); *H01L 24/16* (2013.01); *H01L 24/29* (2013.01); *H01L 24/32* (2013.01); *H01L 24/81* (2013.01); *H01L 24/83* (2013.01); *H01L 24/05* (2013.01); *H01L 24/11* (2013.01); *H01L 24/27* (2013.01); *H01L 2224/0401* (2013.01); *H01L 2224/04026* (2013.01); *H01L 2224/05166* (2013.01); *H01L 2224/05644* (2013.01); *H01L 2224/1132* (2013.01); *H01L 2224/1134* (2013.01); *H01L 2224/1147* (2013.01); *H01L 2224/1332* (2013.01); *H01L 2224/13082* (2013.01); *H01L 2224/13294* (2013.01); *H01L 2224/13305* (2013.01); *H01L 2224/13309* (2013.01); *H01L 2224/13311* (2013.01); *H01L 2224/13313* (2013.01); *H01L 2224/13316* (2013.01); *H01L 2224/13317* (2013.01); *H01L 2224/13318* (2013.01); *H01L 2224/13323* (2013.01); *H01L 2224/13324* (2013.01); *H01L 2224/13339* (2013.01); *H01L 2224/13344* (2013.01); *H01L 2224/13347* (2013.01); *H01L 2224/13349* (2013.01); *H01L 2224/13355* (2013.01); *H01L 2224/13357* (2013.01); *H01L 2224/13364* (2013.01); *H01L 2224/13366* (2013.01); *H01L 2224/13369* (2013.01); *H01L 2224/1601* (2013.01); *H01L 2224/16227* (2013.01); *H01L 2224/16245* (2013.01); *H01L 2224/2732* (2013.01); *H01L 2224/2747* (2013.01); *H01L 2224/2932* (2013.01); *H01L 2224/29294* (2013.01); *H01L 2224/29305* (2013.01);
(Continued)

(58) Field of Classification Search
CPC . H01L 23/4924; H01L 24/81; H01L 21/4853; H01L 2924/013; H01L 2924/014; H01L 2924/01325; H05K 2203/0338
See application file for complete search history.

(56) References Cited

U.S. PATENT DOCUMENTS

2004/0245648 A1 12/2004 Nagasawa et al.
2005/0230667 A1 10/2005 Komagata et al.
(Continued)

FOREIGN PATENT DOCUMENTS

| CN | 1564726 A | 1/2005 |
| CN | 1303175 C | 3/2007 |

(Continued)

OTHER PUBLICATIONS

The State Intellectual Property Office of China, Office Action for Chinese Patent Application No. 201180014602.7, dated Dec. 16, 2014.
(Continued)

*Primary Examiner* — Julio J Maldonado
*Assistant Examiner* — Abbigale Boyle
(74) *Attorney, Agent, or Firm* — Kubotera & Associates, LLC

(57) ABSTRACT

A conductive connecting member formed on a bonded face of an electrode terminal of a semiconductor or an electrode terminal of a circuit board, the conductive connecting member comprising a porous body formed in such manner that a conductive paste containing metal fine particles (P) having mean primary particle diameter from 10 to 500 nm and an organic solvent (S), or a conductive paste containing the metal fine particles (P) and an organic dispersion medium (D) comprising the organic solvent (S) and an organic binder (R) is heating-treated so as for the metal fine particles (P) to be bonded, the porous body being formed by bonded metal fine particles (P) having mean primary particle diameter from 10 to 500 nm, a porosity thereof being from 5 to 35 volume %, and mean pore diameter being from 1 to 200 nm.

15 Claims, No Drawings

(51) Int. Cl.
  *H01L 23/492* (2006.01)
  *H01L 21/48* (2006.01)
  *H01L 23/00* (2006.01)
(52) U.S. Cl.
  CPC ............... *H01L 2224/29309* (2013.01); *H01L 2224/29311* (2013.01); *H01L 2224/29313* (2013.01); *H01L 2224/29316* (2013.01); *H01L 2224/29317* (2013.01); *H01L 2224/29318* (2013.01); *H01L 2224/29323* (2013.01); *H01L 2224/29324* (2013.01); *H01L 2224/29339* (2013.01); *H01L 2224/29344* (2013.01); *H01L 2224/29347* (2013.01); *H01L 2224/29349* (2013.01); *H01L 2224/29355* (2013.01); *H01L 2224/29357* (2013.01); *H01L 2224/29364* (2013.01); *H01L 2224/29366* (2013.01); *H01L 2224/29369* (2013.01); *H01L 2224/3201* (2013.01); *H01L 2224/32227* (2013.01); *H01L 2224/32245* (2013.01); *H01L 2224/81075* (2013.01); *H01L 2224/8184* (2013.01); *H01L 2224/81125* (2013.01); *H01L 2224/81127* (2013.01); *H01L 2224/81191* (2013.01); *H01L 2224/81192* (2013.01); *H01L 2224/81193* (2013.01); *H01L 2224/81203* (2013.01); *H01L 2224/81447* (2013.01); *H01L 2224/83075* (2013.01); *H01L 2224/8384* (2013.01); *H01L 2224/83125* (2013.01); *H01L 2224/83127* (2013.01); *H01L 2224/83191* (2013.01); *H01L 2224/83192* (2013.01); *H01L 2224/83203* (2013.01); *H01L 2224/83447* (2013.01); *H01L 2924/0103* (2013.01); *H01L 2924/01004* (2013.01); *H01L 2924/014* (2013.01); *H01L 2924/01005* (2013.01); *H01L 2924/01006* (2013.01); *H01L 2924/01009* (2013.01); *H01L 2924/01012* (2013.01); *H01L 2924/01013* (2013.01); *H01L 2924/01019* (2013.01); *H01L 2924/01021* (2013.01); *H01L 2924/01022* (2013.01); *H01L 2924/01025* (2013.01); *H01L 2924/01029* (2013.01); *H01L 2924/01032* (2013.01); *H01L 2924/01033* (2013.01); *H01L 2924/01046* (2013.01); *H01L 2924/01047* (2013.01); *H01L 2924/01049* (2013.01); *H01L 2924/01051* (2013.01); *H01L 2924/01078* (2013.01); *H01L 2924/01079* (2013.01); *H01L 2924/01082* (2013.01); *H01L 2924/10253* (2013.01); *H01L 2924/12042* (2013.01); *H01L 2924/15787* (2013.01); *H01L 2924/351* (2013.01); *H05K 2203/0338* (2013.01)

(56) References Cited

U.S. PATENT DOCUMENTS

| | | | |
|---|---|---|---|
| 2007/0152016 A1* | 7/2007 | Choe | B23K 35/025 228/56.3 |
| 2008/0156398 A1 | 7/2008 | Yasuda et al. | |
| 2008/0173398 A1 | 7/2008 | Yasuda et al. | |
| 2009/0096100 A1 | 4/2009 | Kajiwara et al. | |
| 2009/0155597 A1* | 6/2009 | Kropp | C09J 4/00 428/414 |
| 2010/0051319 A1 | 3/2010 | Schmitt et al. | |

FOREIGN PATENT DOCUMENTS

| | | | |
|---|---|---|---|
| JP | 01-191452 A | | 8/1989 |
| JP | 09-326416 A | | 12/1997 |
| JP | 2003-174055 A | | 6/2003 |
| JP | 2004-128357 A | | 4/2004 |
| JP | 2005-116612 A | | 4/2005 |
| JP | 2005-216508 A | | 8/2005 |
| JP | 2007-019144 A | | 1/2007 |
| JP | 2008-208442 A | | 9/2008 |
| JP | 2009-515711 A | | 4/2009 |
| JP | 2009176608 A | * | 8/2009 |
| JP | 2009-253018 A | | 10/2009 |
| JP | 2009-289745 A | | 12/2009 |
| JP | 2009-302511 A | | 12/2009 |
| JP | 2010-059426 A | | 3/2010 |
| WO | 2009/122467 A1 | | 10/2009 |
| WO | 2009-125609 A1 | | 10/2009 |

OTHER PUBLICATIONS

The State Intellectual Property Office of China, Search Report for Chinese Patent Application No. 201180014602.7, dated Nov. 11, 2014.
Office action for Japanese patent application 2011-535810, dated Feb. 29, 2012, Japan Patent Office.
Office action for Japanese patent application 2011-535810, dated Jun. 6, 2012, Japan Patent Office.
Partial supplementary European search report for PCT/JP2011/001642, dated Dec. 4, 2015, European Patent Office.
Extended European search report and European search opinion for PCT/JP2011/001642, dated Mar. 24, 2016, European Patent Office.
XP001526267: Mertens Christian, "Physikalisch-chemischer Hintergrund des NTV-Prozesses," Chapter 3 in Die Niedertemperatur-Verbindungstechnik der Leistungselektronik, pp. 37-72, Dusseldorf, Germany (2004).
XP009178961: C. Mertens et al., "Low temperature Joining Technique for Improved Reliability," Proceedings CIPS 2002; 2nd International Conference on Integrated Power Systems, pp. 95-100, Jun. 11, 2002, Bremen, Germany.
XP002751059: Theodore Nicholas, "LCH-HCF Interactions. Sub chapter 4-1. Small Cracks and the Kitagawa Diagram," Chapter 4 in High Cycle Fatigue. A Mechanics of Material Perspective, pp. 145-153, Boston, U.S.A. (2006).
"Terpineol," Wikipedia; Free Encyclopedia, Mar. 12, 2010. Retrieved from Internet on Nov. 17, 2015: URL: https://en.wikipedia.org/w/index.php?title=Terpineol&oldid=349495403.
Notification of Reason for Refusal for Korean Patent Application No. 10-2012-7026993 from KIPO (Korean Intellectual Property Office) dated Sep. 6, 2016.
'Ethylene glycol', Wikipedia; Free Encyclopedia, Mar. 12, 2010, Retrieved from Internet: URL: https://en.wikipedia.org/w/index.php?title=Ethylene_glycol&oldid=349504611.
Lu G-Q et al.: "A Lead-Free, Low-Temperature Sintering Die-Attach Technique for High-Performance and High-Tempertature Packaging", High density microsystem design and packaging and component failure analysis, 2004 (HDP '04), Proceedings of the 6th IEEE CPMT conference on, Shanghai, China, Jun. 30-Jul. 3, 2004, IEEE, Piscataway, NJ, USA, p. 42-46, DOI: 10.1109/HPD.2004.1346671, ISBN: 978-0-7803-8620-4.
Communication pursuant to Article 94(3) EPC issued by European Patent Office dated Feb. 10, 2017.

* cited by examiner

CONDUCTIVE CONNECTING MEMBER AND MANUFACTURING METHOD OF SAME

TECHNICAL FIELD

The present invention relates to a conductive connecting member formed on a bonded face of an electrode terminal of a semiconductor device or an electrode terminal of a circuit board and a method of manufacturing same. In detail, the present invention relates to a conductive connecting member such as a conductive bump, conductive die bonding portion or the like comprising a porous body, which is formed in such manner that a conductive paste containing metal fine particles having mean primary particle diameter of nano size (nano size is referred to as less than 1 μm, the same is applied hereunder) and an organic dispersion medium, mounted on a bonded face of an electrode terminal of a semiconductor device or an electrode terminal of a circuit board, is heating-treated to bond nano sized metal fine particles, with nano sized pores distributed between the metal fine particles, and a method of manufacturing same. The content of Japanese Patent Application No. 2010-063436 filed on Mar. 19, 2010 which is the basic application of the present application is incorporated in the present application as a reference document forming a part of the present specification.

BACKGROUND ART

Lately, a high density is promoted in a semiconductor mounting technology to realize high functionality, enhanced performance, and downsizing of electronic devices. A wire bonding technology (WB), a tape automated wire bonding (TAB) technology relating to a wireless bonding technology, and a flip chip bonding (FCB) technology are listed as a representative technology of bonding method for bonding semiconductor devices, as well as a semiconductor device and a circuit board. Among them, as the technology to mount in high density semiconductor devices such as computer, the flip chip bonding (FCB) technology enabling the highest density mounting has been widely applied. The flip chip bonding bonds bumps (protruding part) formed on the semiconductor device or the like to the circuit board or the like. The bumps are formed mainly by means of plating process.

According to the plating process for forming bumps, it is possible to form finely patterned bumps. In addition, the height of the bump is intended to be controlled under the various conditions. However, there is a problem in which the height of the bumps is varied to some extent. As the remedy for the variation of the height of the bumps so as to prevent the contact failure of the electrode, the pressure is applied during the bonding in order to closely contact all the bumps. The above described method is possible. However, the excessively applied pressure causes the strain to remain within the bump, and lowers the thermal stress resistance to result in the breakage. Accordingly, the structure of the bump for connecting to the metal fine pattern has preferably soft and flexible structure when the pressure is applied. In addition, the bump formed by means of the plating has a problem in which cracks and fractures are caused supposedly due to the fatigue failure in the process of the usage. In the flip chip bonding (FCB) technology, in case that the material forming the semiconductor device is different from the material forming the circuit wiring board, the stress strain is caused on the solder bump electrode due to the difference of the expansion coefficients. The above described stress strain damages the solder bump electrode to lower a reliable life time.

Patent document 1 discloses a connecting bump used for electrically connecting a conducting wiring circuit on a substrate and other substrate or component, which is formed in such manner that an opening portion is arranged on a substrate with the use of a photosensitive resin, then metal fine particles having mean primary diameter from 0.1 μm to 50 μm is filled therein, and then baked.

Patent document 2 discloses nano porous solder formed in such manner that a nano solder precursor using nano particles is mixed with a foaming agent, then thus prepared mixture is placed on the die, and then the foaming solder precursor is swelled.

Patent document 3 discloses a bump obtained by sintering a metal paste without glass frit, which contains metal powders comprising gold, silver or palladium powder having mean particle diameter from 0.005 to 1.0 μm, and an organic solvent, at a temperature from 200 to 400 degrees C. It is disclosed that when the metal paste without the glass frit is used, the sintered body which is relatively soft and has elasticity can be formed on a semiconductor wafer.

Patent document 4 discloses bumps comprising a Au plating layer provided in a fine hole of a photo resist layer formed on a substrate (first bump layer, height of 10 μm) and a sintered body (a second bump layer) provided on the Au layer, in which Au paste as a metal paste is fallen as a drop and filled, and then sintered to form the sintered body.

PRIOR ART DOCUMENT

Patent Document

Patent document 1: Japanese Patent Application Publication No. 2003-174055
Patent document 2: Japanese Patent Application Publication No. 2009-515711
Patent document 3: Japanese Patent Application Publication No. 2005-216508
Patent document 4: Japanese Patent Application Publication No. 2009-302511

DISCLOSURE OF THE INVENTION

Problems to be Solved by the Invention

The porous body disclosed in Patent document 1 has the structure in which there exists micron sized pores between bonded micron sized metal particles (namely, more than 1 μm, less than 1000 μm). According to the theory of propagation of crack in the metal material, there is known that the crack (consider as a hole) does not expand when the size of the crack is sufficiently small, even though a large stress is applied (refer to Japan Society of Materials Science edition, Fatigue design handbook, Jan. 20, 1995, published by Youk-endo, pages 148 to 195). In this case, it is presumed, for example, that the bump having nano sized holes has stress resistance about 100 times of that of the bump having micron sized holes.

Patent document 3 discloses a process of forming a bump from the metal paste using the metal powder having mean particle diameter from 0.005 to 1.0 μm. In the forming process of the bump, a through hole is formed on the resist covering the surface of the wafer, then the metal paste is filled in the through hole, then the paste is dried, then the resist is removed from the surface of the wafer, and then a protruding substance comprising metal powder is sintered. However, there is no disclosure of the use of the organic solvent to enhance the dispersion of the metal particles in the metal paste, and the porosity and pore size of the formed sintered body forming the bump, and in addition, there is no disclosure of the improvement in the thermal cycle of the conductive bump.

The bump disclosed in Patent document 4 forms two layers structure comprising the first bump layer of the bulk body of the conductive metal formed on the substrate, and a second bump layer of the sintered body of the second conductive metal powder on the first bump layer, so as to enable to compensate the variation in the bump height. In the above bump, the bulk metal body as a main portion is placed on the tip portion of the bump of the sintered body having elasticity to compensate the rigidity by means of the first bump layer, so as to control the deformation in the lateral direction of the bump during the flip chip bonding. Together with the above, due to the elasticity of the second bump layer, deformation is implemented in accordance with the variation of the bump height, thus enabling the bonding excellent in flatness at a low pressure. In this case, the opening portion is formed in the resist film of the substrate, then the gold plating layer is formed in the opening portion, then the metal paste is applied and dried, and then baked to prepare the bump so that the process steps become complicated. Furthermore, as described in Patent document 3 above, there is no disclosure of the use of the organic solvent to enhance the dispersion of the metal particles in the metal paste, and the porosity and pore size of the formed sintered body forming the bump, and in addition, there is no disclosure of the improvement in the thermal cycle of the conductive bump.

In case that the adhesiveness is poor at a die bonding portion which is the connecting structure portion between the semiconductor device and the interposer, the backside of the semiconductor device or the adhesive interface between the interposer connecting terminal and the conductive die bonding portion is partially peeled or completely peeled off due to a mechanical stress (outer stress, inner stress) or physical stress (thermal stress).

According to the demand to realize the high functional device, the development of the device which is operational at the high temperature becomes increasingly active. Accordingly, the temperature range of the heat cycle to be secured is enlarged, and the development of the bonded portion excellent in the heat cycle resistant characteristics is expected. Furthermore, since the pitch and the area of the electrode terminal become small together with the high density inclination of the semiconductor device, in relation to the conductive bump used for flip-chip mounting of the semiconductor device on the substrate, the flexibility, elasticity and ductility of the sintered body are expected to function so as to form the conductive connecting member such as the conductive bump, conductive die bonding portion or the like excellent in the heat cycle resistant characteristics.

Means for Solving the Problem

In view of the above described prior art, the inventors have found the following and completed the invention. When the metal porous body, for the conductive connecting member such as the conductive bump, conductive die bonding portion or the like, formed with the use of nano sized metal fine particles has the porosity from 5 to 35 volume % and the size of the pore is nano size, the porous body has excellent thermal cycle characteristics. More specifically, the present invention is summarized as the following (1) to (14) inventions.

(1) A conductive connecting member formed on a bonded face of an electrode terminal of a semiconductor or an electrode terminal of a circuit board, the conductive connecting member comprising a porous body formed in such manner that a conductive paste containing metal fine particles (P) having mean primary particle diameter from 10 to 500 nm and an organic solvent (S), or a conductive paste containing the metal fine particles (P) and an organic dispersion medium (D) comprising the organic solvent (S) and an organic binder (R) is heating-treated so as for the metal fine particles (P) to be bonded, the porous body being formed by bonded metal fine particles (P) having mean primary particle diameter from 10 to 500 nm, a porosity thereof being from 5 to 35 volume %, and mean pore diameter being from 1 to 200 nm (which may be called hereunder as the first embodiment).

(2) The conductive connecting member described in the above (1), wherein the conductive connecting member is a conductive bump to connect semiconductor devices.

(3) The conductive connecting member described in the above (1), wherein the conductive connecting member is a conductive die bonding portion to connect a semiconductor device and a conductive substrate.

(4) A method of manufacturing a conductive connecting member comprising: a step of mounting a conductive paste containing metal fine particles (P) having mean primary particle diameter from 10 to 500 nm and an organic solvent (S) or a conductive paste containing the metal fine particles (P) and an organic dispersion medium (D) comprising the organic solvent (S) and an organic binder (R) on an electrode terminal of a semiconductor device of an electronic component or a circuit board, or a bonded face of a conductive substrate (step 1);

a step of aligning a bonded face of other electrode terminal or a conductive substrate to be connected on the conductive connecting member precursor (step 2);

a step of heat-treating both of the electrode terminals or the electrode terminal and the conductive substrate, and the conductive connecting member precursor at a temperature from 150 to 350 degrees C. to form a conductive connecting member comprising a porous body prepared by bonding the metal fine particles having mean primary particle diameter from 10 to 500 nm, a porosity thereof being from 5 to 35 volume %, and mean pore diameter being from 1 to 200 nm so as to bond both of the bonded surfaces (step 3).

(5) The method of manufacturing a conductive connecting member described in the above (4), wherein in the step 1, a mixing ratio (P/D) of the metal fine particles (P) and the organic dispersion medium (D) is from 50 to 85 mass % for P and from 50 to 15 mass % for D in the conductive paste, and a mixing ratio of (S/R) of the organic solvent (S) and the organic binder (R) is from 80 to 100 mass % for S and from 20 to 0 mass % for R in the organic dispersion medium (a total of mass % is 100 mass %, respectively).

(6) The method of manufacturing a conductive connecting member described in the above (4) or (5), wherein in the step 1, the metal fine particles (P) comprises at least first metal fine particles including one or more than two kinds selected from a group consisting of copper, nickel, cobalt, palladium, silver, platinum and gold, or 90 to 100 mass % of first metal fine particles (P1), and 10 to 0 mass % of second metal fine particles (P2) including one or more than two kinds selected from a group consisting of magnesium, aluminum, zinc, gallium, indium, tin, antimony, lead, bismuth, titanium, manganese, and germanium (a total of mass % is 100 mass %).

(7) The method of manufacturing a conductive connecting member described in the above (6), wherein the second metal fine particles (P2) and the first metal fine particles (P1) form an alloy within the metal fine particles (P), or the second metal fine particles (P2) forms a cover layer on a surface of the first metal fine particles (P1).

(8) The method of manufacturing a conductive connecting member described in any one of the above (4) to (7), wherein in the step 1, the organic solvent (S) comprises one selected from (i) an organic solvent (S1) comprising alcohol and/or polyalcohol having a boiling point of at least 100 degrees C. at a normal pressure and one or more than two hydroxyl groups within molecule, (ii) an organic solvent (S2) including 5 to 90 volume % of an organic solvent (SA) having at least amide group, 5 to 45 volume % of an organic solvent (SB) having a boiling point from 20 to 100 degrees C. at a normal pressure, and 5 to 90 volume % of an organic solvent (SC) comprising alcohol and/or polyalcohol having a boiling point of at least 100 degrees C. at a normal pressure and one or more than two hydroxyl groups within molecule, and (iii) an organic solvent (S3) including 5 to 95 volume % of an organic solvent (SA) having at least amide group, and 5 to 95 volume % of an organic solvent (SC) comprising alcohol and/or polyalcohol having a boiling point of at least 100 degrees C. at a normal pressure and one or more than two hydroxyl groups within molecule.

(9) The method of manufacturing a conductive connecting member described in the above (8), wherein the organic solvent (S1) or (SC) comprises one or more than two kinds selected from the group consisting of ethylene glycol, diethylene glycol, 1,2-propanediol, 1,3-propanediol, 1,2-butandiol, 1,3-butanediol, 1,4-butanediol, 2-butene-1,4-diol, 2,3-butanediol, pentanediol, hexanediol, octanediol, glycerol, 1,1,1-tris hydroxymethyl ethane, 2-ethyl-2-hydroxymethyl-1,3-propanediol, 1,2,6-hexanetriol, 1,2,3-hexanetriol, 1,2,4-butanetriol, 1,2,6-hexanetriol, 1,2,3-hexanetriol, 1,2,4-butanetriol, threitol, erythritol, pentaerythritol, pentitol, and hexitol.

(10) The method of manufacturing a conductive connecting member described in the above (8), wherein the organic solvent (SA) comprises one or more than two kinds selected from the group consisting of N-methylacetamide, N-methylformamide, N-methylpropaneamide, formamide, N,N-dimethylacetamide, 1,3-dimethyl-2-imidazolidinone, N,N-dimethylformamide, 1-methyl-2-pyrolidone, hexamethylphosphoric triamide, 2-pyrrolidinone, ε-caprolactam, and acetamide.

(11) The method of manufacturing a conductive connecting member described in the above (8), wherein the organic solvent (SB) comprises one or more than two kinds selected from the group consisting of ether compound (SB1) expressed by a general form $R^1$—O—$R^2$ ($R^1, R^2$ is independently alkyl group, number of carbon atoms: 1 to 4), alcohol (SB2) expressed by a general form $R^3$—OH ($R^3$ is alkyl group, number of carbon atoms: 1 to 4), ketone compound (SB3) expressed by a general form $R^4$—C(=O)—$R^5$ ($R^4, R^5$ is independently alkyl group, number of carbon atoms: 1 to 2), and amine compound (SB4) expressed by a general form $R^6$—(N—$R^7$)—$R^8$ ($R^6, R^7, R^8$ is independently alkyl group or hydrogen atom, number of carbon atoms: 0 to 2).

(12) The method of manufacturing a conductive connecting member described in any one of the above (8) to (11), wherein the organic solvent (SB) comprises ether compound (SB1) comprising one or more than two kinds selected from the group consisting of diethyl ether, methyl propyl ether, dipropyl ether, diisopropyl ether, methyl-t-butyl ether, t-amyl methyl ether, divinyl ether, ethyl vinyl ether, and allyl ether; alcohol (SB2) comprising one or more than two kinds selected from the group consisting of methanol, ethanol, 1-propanol, 2-propanol, 2-butanol, and 2-methyl 2-propanol; ketone compound (SB3) comprising one or more than two kinds selected from the group consisting of acetone, methyl ethyl ketone, and diethyl ketone; and/or amine compound (SB4) comprising one or more than two kinds selected from the group consisting of triethylamine and/or diethylamine.

(13) The method of manufacturing a conductive connecting member described in any one of the above (4) to (12), wherein the organic binder (R) comprises one or more than two kinds selected from the group consisting of cellulose resin binder, acetate resin binder, acrylic resin binder, urethane resin binder, polyvinilpyrroridone resin binder, polyamide resin binder, butyral resin binder, and terpene binder.

(14) The method of manufacturing a conductive connecting member described in the above (13), wherein the cellulose resin binder comprises one or more than two kinds selected from the group consisting of acetylcellulose, methyl cellulose, ethylcellulose, butylcellulose, and nitrocellulose; the acetate resin binder comprises one or more than two kinds selected from the group consisting of methyl glycol acetate, ethyl glycol acetate, butyl glycol acetate, ethyl diglycol acetate, and butyl diglycol acetate; the acrylic resin binder comprises one or more than two kinds selected from the group consisting of methyl methacrylate, ethyl methacrylate, and butylmethacrylate; the urethane resin binder comprises one or more than two kinds selected from the group consisting of 2,4-tolylenediisocyanate, and p-phenylene diisocyanate; the polyvinilpyrroridone resin binder comprises one or more than two kinds selected from the group consisting of polyvinil pyrolidone, and N-vinil pyrolidone; the polyamide resin binder comprises one or more than two kinds selected from the group consisting of polyamide 6, polyamide 66, and polyamide 11; the butyral resin binder comprises polyvinil butyral; and the terpene binder comprises one or more than two kinds selected from the group consisting of pinene, cineol, limonene, and terpineol.

Effect of the Invention (i) Since the conductive connecting member as the first embodiment described in the above (1) comprises the metal porous body which is formed by bonding the metal fine particles each having mean particle diameter from 10 to 500 nm, and has the porosity from 5 to 35 volume % and mean pore diameter from 1 to 200 nm, the elasticity and flexibility thereof is improved and the thermal cycle characteristics thereof is excellent so as to have excellent crack resistance.

(ii) Since the method of manufacturing the conductive connecting member as the second embodiment described in the above (4) uses the conductive paste containing the metal fine particles (P) having mean primary particle diameter from 10 to 500 nm and the organic solvent (S), or the conductive paste containing the metal fine particles (P) and the organic dispersion medium (D) comprising the organic solvent (S) and the organic binder (R), it is possible to obtain the conductive connecting member of the metal porous body formed by bonding the metal fine particles having mean particle diameter from 10 to 500 nm, and having the porosity from 5 to 35 volume % and the mean pore diameter from 1 to 200 nm. The conductive connecting member, as described in the above first embodiment, has the excellent thermal cycle characteristics, thus having excellent crack resistance.

EMBODIMENTS FOR CARRYING OUT THE INVENTION

[1] The conductive connecting member of the first embodiment and [2] the method of manufacturing the conductive connecting member of the second embodiment are described hereunder.

[1] Conductive Connecting Member of the First Embodiment

The conductive connecting member as the first embodiment of the present invention is the conductive connecting member formed on a bonded face of an electrode terminal of a semiconductor or an electrode terminal of a circuit board, the conductive connecting member comprising a porous body formed in such manner that a conductive paste containing the metal fine particles (P) having mean primary particle diameter from 10 to 500 nm and an organic solvent (S), or a conductive paste containing the metal fine particles (P) and an organic dispersion medium (D) comprising the organic solvent (S) and an organic binder (R) is heating-treated so as for the metal fine particles (P) to be bonded, the porous body being formed by bonded the metal fine particles (P) having mean primary particle diameter from 10 to 500 nm, a porosity thereof being from 5 to 35 volume %, and mean pore diameter being from 1 to 200 nm.

As the conductive connecting member of the first embodiment, there are listed the conductive bump, conductive die bonding portion or the like. The conductive bump is the conductive connecting member to connect the semiconductor devices, for example. The conductive die bonding portion is the conductive connecting member placed on the conductive substrate to connect the semiconductor device. It can be conceivable that a stud type conductive connecting member is arranged on the electrode terminal face of the electronic component, and then the conductive connecting member of the invention is formed through the above described conductive connecting member to electrically connect to the electrode pattern.

(1) Metal Porous Body Formed by Heat-treating the Conductive Paste

The conductive connecting member of the first embodiment of the invention is the conductive connecting member formed on a bonded face of an electrode terminal of a semiconductor or an electrode terminal of a circuit board, and the conductive connecting member comprises a porous body formed in such manner that a conductive paste containing metal fine particles (P) having mean primary particle diameter from 10 to 500 nm and an organic solvent (S), or a conductive paste containing the metal fine particles (P) and an organic dispersion medium (D) comprising the organic solvent (S) and an organic binder (R) is heating-treated so as for the metal fine particles (P) to be bonded.

The method of preparing the metal porous body by heat-treating the conductive paste to bond the metal fine particles is described in the second embodiment.

(2) Metal Porous Body Formed by Heat-treating the Conductive Paste

In the conductive connecting member as the first embodiment, the metal porous body obtained by heating-treating the conductive paste containing the metal fine particles (P) having mean particle diameter from 10 to 500 nm and the organic dispersion medium (D) is formed by bonding the metal fine particles on the surface of the particles. Accordingly, the particle shape of the metal fine particles (P) is almost maintained as of before the heating-treatment (before sintering), however, there are many cases in which the particle shape varies to a large extent.

With the mean particle diameter of the metal fine particles before the heating-treatment being less than 10 nm, it likely becomes difficult to form the uniform particle diameter and pore over the entire porous body due to the heating-treatment (sintering), thus lowering the thermal cycle characteristics to deteriorate the crack resistance. On the other hand, with the mean particle diameter being over 500 nm, the metal fine particles constructing the metal porous body and the pore diameter become near micron size, lowering the thermal cycle characteristics.

The mean particle diameter of the metal fine particles before the heating-treatment can be measured with the use of the scanning type electron microscope. For example, in case that the shape in the two dimensions is about circular form, the diameter of the circular form is measured. In case that the shape in the two dimensions is about ellipse, the short diameter of the ellipse is measured. In similar manner, the length of the side for about quadrate, the length of the short side for about the rectangle is respectively measured. The mean particle diameter is calculated in such manner that 10 to 20 are selected at random, then the particle diameters thereof are observed with the above microscope to measure same, and then mean value thereof is calculated.

As the metal fine particles (P) constructing the metal porous body, considering conductivity, and sintering at the time of heating treatment, the metal fine particles can be used, which comprises (i) at least the first metal fine particles (P1) including one or more than two kinds selected from a group consisting of copper, nickel, cobalt, palladium, silver, platinum and gold, or (ii) 90 to 100 mass % of the first metal fine particles (P1), and 10 to 0 mass % of the second metal fine particles (P2) including one or more than two kinds selected from a group consisting of magnesium, aluminum, zinc, gallium, indium, tin, antimony, lead, bismuth, titanium, manganese, and germanium (a total of mass % is 100 mass %).

Practical example of the method of manufacturing the metal fine particles (P), and the bonding state of the second metal fine particles (P2) in the metal fine particles (P) are the same as described in the second embodiment described later.

(3) Mean Pore Diameter Existing Among the Metal Fine Particles

The mean pore diameter of the pores of the metal porous body in the conductive connecting member of the invention is within a range from 1 to 200 nm. Since the conductive connecting member of the invention is obtained by heating-treating (sintering) the conductive paste containing the metal fine particles (P) having mean primary particle diameter from 10 to 500 nm, the above described mean pore diameter can be obtained. With the mean pore diameter being 200 or less than 200 nm, the thermal cycle characteristics is further improved so as to attain excellent crack resistance. With the mean pore diameter being less than 1 nm, it likely is difficult to form the uniform metal porous body.

The shape of the pore may be any form such as circular form, ellipse form, quadrate form, rectangle form, hexagonal form, or the like. Here, the mean pore diameter is the diameter of the maximum inscribed circle for the opening portion of the pore. For example, in case that the shape is about circular form, the diameter of the circular form is measured. In case that the shape is about ellipse, the short diameter of the ellipse is measured. In similar manner, the length of the side for about quadrate, the length of the short side for about the rectangle is respectively measured. The mean particle diameter is calculated in such manner that 10 to 20 are selected at random, then the particle diameters thereof are observed with the above microscope to measure same, and then mean value thereof is calculated.

(4) Porosity of the Metal Porous Body

The porosity of the metal porous body in the conductive connecting member of the invention is from 5 to 35 volume %. With the porosity being less than 5 volume %, it comes near the bulk metal constructing the conductive connecting member, thus lowering elasticity and flexibility thereof, which result in poor thermal cycle characteristics and crack resistance. On the other hand, with the porosity being over 35 volume %, the mechanical strength is lowered and the contact between the metal fine particles becomes insufficient, thus lowering the conductivity.

The porosity can be adjusted by the mixing ratio between the metal fine particles (P) and the organic dispersion medium (D) in the conductive paste. The porosity can be measured with the use of the transmission type electron microscope (TEM), the scanning type electron microscope (SEM) or the like. When measured by the electron microscope, an electron microscope picture is taken, then the cross sectional image is analyzed so as to decide the porosity. In case that the pore size is smaller than 100 nm, it is sliced into thin section by the ultramicrotome process or ion milling process, and observed with the use of the transmission type electron microscope (TEM) to measure same.

(5) Conductive Connecting Member

The conductive connecting member of the first embodiment is obtained by appropriately heating-treating (sintering) the metal fine particles (P). The conductive connecting member formed by sintering the metal fine particles (P) is porous and relatively soft, thus having elasticity, although it depends on the grain size of the metal powder to be used and the sintering condition. The above described soft conductive connecting member has excellent quality to last long to the stress produced within the conductive connecting member due to the thermal expansion difference between the electrode terminals on the substrate. The mechanical characteristics of the conductive connecting member of the invention include good elasticity in comparison with the bulk metal (i.e., the bump material or the like formed by plating), so as to absorb the strain due to the expansion-shrinkage, thus, preventing the fatigue breakdown.

[2] Method of Manufacturing the Conductive Connecting Member Described in the Second Embodiment The method of manufacturing the conductive connecting member as the second embodiment of the invention is a method of manufacturing the conductive connecting member, which comprises: a step of mounting a conductive paste containing metal fine particles (P) having mean primary particle diameter from 10 to 500 nm and an organic solvent (S) or a conductive paste containing the organic solvent (S) and an organic dispersion medium (D) comprising the organic solvent (S) and an organic binder (R) on an electrode terminal of a semiconductor device of an electronic component or a circuit board, or a bonded face of a conductive substrate (step 1);

a step of aligning a bonded face of other electrode terminal or a conductive substrate to be connected on the conductive connecting member precursor (step 2);

a step of heating-treating both of the electrode terminals or the electrode terminal and the conductive substrate, and the conductive connecting member precursor at a temperature from 150 to 350 degrees C. to form a conductive connecting member comprising a porous body prepared by bonding the metal fine particles having mean primary particle diameter from 10 to 500 nm, a porosity thereof being from 5 to 35 volume %, and mean pore diameter being from 1 to 200 nm so as to bond both of the bonded surfaces (step 3).

[2-1] Step 1

The step 1 is the step of mounting a conductive paste containing the metal fine particles (P) having mean primary particle diameter from 10 to 500 nm and the organic solvent (S) or a conductive paste containing the metal fine particles (P) and the organic dispersion medium (D) comprising the organic solvent (S) and an organic binder (R) on a bonded face of a semiconductor device of an electronic component, an electrode terminal of a circuit board or a conductive substrate.

(1) Metal Fine Particles (P)

The reason why the mean primary particle diameter of the metal fine particles (P) from 10 to 500 nm is favorable, as well as the way to measure the particle diameter is the same as described in the first embodiment.

As the metal fine particles (P) constructing the metal porous body, from the points of view of conductive property, sinterability at the heating-treatment (sintering), and productivity, as the metal fine particles (P) constructing the metal porous body, the metal fine particles is favorable, which comprises (i) at least the first metal fine particles (P1) including one or more than two kinds selected from a group consisting of copper, nickel, cobalt, palladium, silver, platinum and gold, or (ii) 90 to 100 mass % of the first metal fine particles (P1), and 10 to 0 mass % of the second metal fine particles (P2) including one or more than two kinds selected from a group consisting of magnesium, aluminum, zinc, gallium, indium, tin, antimony, lead, bismuth, titanium, manganese, and germanium (a total of mass % is 100 mass %).

The first metal fine particles (P1) comprise a metal having relatively high conductivity, and on the other hand, the second metal fine particles (P2) comprise a metal having a relatively low boiling point. When the first metal fine particles (P1) are used together with the second metal fine particles (P2), it is preferable that the second metal fine particles (P2) and the first metal fine particles (P1) are alloyed within the metal fine particles (P), or the second metal fine particles (P2) form a covering layer on the surface of the first metal fine particles (P1) within the metal fine particles (P). When the first metal fine particles (P1) are used together with the second metal fine particles (P2), the temperature of the heating-treatment can be lowered, and the bonding between the metal fine particles can be facilitated.

The method of manufacturing the metal fine particles (P1) and the metal fine particles (P2) is not particularly limited. For example, wet chemical process, atomization, the plating, plasma CVD, MOCVD or the like can be used.

Practically as the method of manufacturing the metal fine particles (P1) having mean primary particle diameter from 10 to 500 nm in the present invention, the method disclosed in Japanese Patent Application Publication No. 2008-231564 can be applied. When the above disclosed method is applied, the metal fine particles (P1) having mean primary particle diameter from 10 to 500 nm can be easily obtained. In addition, in the above disclosed method of manufacturing the metal fine particles, the metal fine particles (P) with the impurity in the reaction aqueous removed, which is obtained in such manner that after the reduction reaction of the metal ion, the agglomerating agent is added to the reduction reaction aqueous, and collected by means of the centrifugal separation, are added to the organic dispersion medium (D) and the obtained mixture is kneaded to enable to manufacture the conductive paste of the invention.

(2) Organic Dispersion Medium (D)

It is important in the present invention that the specific organic dispersion medium (D) is selected, which has excellent dispersion and sintering during the heating treatment in order to uniformly disperse the metal fine particles (P) in the conductive paste. The organic dispersion medium (D) functions to disperse the metal fine particles in the conductive paste, to adjust the viscosity of the conductive paste, to maintain the shape of the conductive connecting member precursor such as the conductive bump precursor, conductive die bonding portion or the like, and to act as the reducing agent in the liquid and gas state during the heating treatment. The organic dispersion medium (D) comprises the organic solvent (S), or the organic solvent (S) and the organic binder (R).

(2-1) Organic Solvent(S)

It is preferable that the organic solvent (S) comprises one selected from (i) an organic solvent (S1) comprising alcohol and/or polyalcohol having a boiling point of at least 100 degrees C. at a normal pressure and one or more than two hydroxyl groups within molecule, (ii) an organic solvent (S2) including 5 to 95 volume % of an organic solvent (SA) having at least amide group, 5 to 90 volume % of an organic solvent (SB) having a boiling point from 20 to 100 degrees C. at a normal pressure, and 5 to 90 volume % of an organic solvent (SC) comprising alcohol and/or polyalcohol having a boiling point of at least 100 degrees C. at a normal pressure and one or more than two hydroxyl groups within molecule, and (iii) an organic solvent (S3) including 5 to 95 volume % of an organic solvent (SA) having at least amide group, and 5 to 90 volume % of an organic solvent (SC) comprising alcohol and/or polyalcohol having a boiling point of at least 100 degrees C. at a normal pressure and one or more than two hydroxyl groups within molecule.

When the other organic solvent constituent than the above is blended, such polar organic solvent can be used as tetrahydrofuran, diglyme, ethylene carbonate, propylene carbonate, sulfolane, dimethyl sulfoxide.

The organic solvent (S) is expected to function to uniformly disperse the metal fine particles (P) in the conductive paste, to adjust the appropriate viscosity, and to adjust drying or baking speed during the heating treatment of the printed (applied) conductive connecting member precursor.

(a) Organic Solvent (S1)

The organic solvent (S1) comprises alcohol and/or polyalcohol having a boiling point of at least 100 degrees C. at a normal pressure and one or more than two hydroxyl groups within molecule, and has a reducing character. In addition, the organic solvent (S1) is somewhat inferior in dispersibility to the organic solvent (S2) and the organic solvent (S3), and can be baked at a lower temperature in comparison with the organic solvent (S2) and the organic solvent (S3). Furthermore, when the organic solvent (S1) is added to the mixed organic solvent, the uniformity of the metal porous body is improved, in case that the conductive paste is printed (applied) on the bonded surface of the electrode terminal of the semiconductor device or the electrode terminal of the circuit board, in addition, the effect of reducing acceleration of the oxide layer is performed so as to obtain high conductive baked layer. As far as the above described feature is effectively functioned, other organic solvent can be added to the organic solvent (S1). In this case, the amount of the added other organic solvent is preferably less than 10 volume %, more preferably less than 5 volume %.

(b) Organic Solvent (S2)

The organic solvent (S2) includes 5 to 90 volume % of an organic solvent (SA) having at least amide group, 5 to 45 volume % of an organic solvent (SB) having a boiling point from 20 to 100 degrees C. at a normal pressure, and 5 to 90 volume % of an organic solvent (SC) comprising alcohol and/or polyalcohol having a boiling point of at least 100 degrees C. at a normal pressure and one or more than two hydroxyl groups within molecule.

The organic solvent (SA) is contained in the organic solvent (S2) with the amount from 5 to 90 volume % to improve dispersibility and store-stability in the conductive paste, in addition, to improve adhesiveness at the bonded face when the conductive paste on the bonded face is heating-treated to form the metal porous body. The organic solvent (SB) is contained in the organic solvent (S2) with the amount from 5 to 45 volume % to lower the interaction between the medium molecules in the conductive paste, thus improving the affinity of the metal fine particles (P) to the organic solvent (S2).

The organic solvent (SC) is contained in the organic solvent (S2) with the amount from 5 to 90 volume % to enable to stabilize the dispersibility even for a long period of time. Furthermore, when the organic solvent (SC) is added to the mixed organic solvent, the uniformity of the metal porous body is improved, in case that the conductive paste is printed (applied) on the bonded surface of the electrode terminal, in addition, the effect of reducing acceleration of the oxide layer is performed so as to obtain high conductive connecting member. The constituent of the organic solvent (SC) is the same as of the organic solvent (S1).

As described above, the organic solvent (S2) includes at least 5 to 90 volume % of an organic solvent (SA), 5 to 45 volume % of the organic solvent (SB), and 5 to 90 volume % of the organic solvent (SC). This means that the organic solvent (SA), the organic solvent (SB), the organic solvent (SC) are mixed in the organic solvent (S2) in such manner as to be the total of 100 volume %. Furthermore, other organic solvent constituent may be added within the above described ranges, as far as the effect of the invention is secured. In this case, it is favorable that the total of the organic solvent (SA), the organic solvent (SB), and the organic solvent (SC) is more than 90 volume %, and more favorably more than 95 volume %.

(c) Organic Solvent (S3)

The organic solvent (S3) includes 5 to 95 volume % of an organic solvent (SA) having at least amide group, and 5 to 95 volume % of the organic solvent (SC) comprising alcohol and/or polyalcohol having a boiling point of at least 100 degrees C. at a normal pressure and one or more than two hydroxyl groups within molecule.

The organic solvent (SA) is contained in the organic solvent (S3) with the amount from 5 to 95 volume % to improve dispersibility and store-stability in the conductive paste, in addition, to improve adhesiveness at the bonded face when the conductive paste on the bonded face is heating-treated to form the metal porous body.

The organic solvent (SC) is contained in the organic solvent (S3) with the amount from 5 to 95 volume %, to further improve the dispersibility in the conductive paste. Furthermore, when the organic solvent (SA) and the organic solvent (SC) are mixed in the organic solvent (S3), the sintering can be promoted even at a relatively lower heating-treating temperature, in case that the conductive paste is printed (applied) on the bonded face of the electrode terminal of the semiconductor device or the electrode terminal of the circuit board and is heating-treated.

As described above, the organic solvent (S3) contains 5 to 95 volume % of organic solvent (SA), and 5 to 95 volume % of the organic solvent (SC). This means that the organic solvent (SA) and the organic solvent (SC) are mixed in the organic solvent (S3) in such manner as to be the total of 100 volume %. Furthermore, other organic solvent constituent may be added within the above described ranges, as far as the effect of the invention is secured. In this case, it is favorable that the total of the organic solvent (SA) and the organic solvent (SC) is more than 90 volume %, and more favorably more than 95 volume %.

(2-2) Constituent of the Organic Solvent (S)

The practical examples of the above described organic solvent (S1), the organic solvent (SA), and the organic solvent (SB) are shown hereunder. As described above, the constituent of the organic solvent (SC) is the same as of the organic solvent (S1).

(a) Organic Solvent (S1)

The organic solvent (S1) comprises alcohol and/or polyalcohol having a boiling point of at least 100 degrees C. at a normal pressure and one or more than two hydroxyl groups within molecule, and has the reducing character. The alcohol with the carbon number being more than 5 and the polyalcohol with the carbon number being more than 2 are favorable, in addition, it is favorable which is liquid at the normal temperature, and has high relative permittivity, for example more than 10. Since the metal fine particles (P) having mean primary particle diameter from 10 to 500 nm has a large surface area, the affection of the oxidation should be considered. However, since the following organic solvent (51) functions as the reducing agent in a liquid or gas state during the heating-treatment (sintering), the oxidation of the metal fine particles is prevented during the heating-treatment to accelerate the sintering.

As the practical example of the organic solvent (S1), the followings are exemplified: ethylene glycol, diethylene glycol, 1,2-propanediol, 1,3-propanediol, 1,2-butandiol, 1,3-butanediol, 1,4-butanediol, 2-butene-1,4-diol, 2,3-butanediol, pentanediol, hexanediol, octanediol, glycerol, 1,1,1-tris hydroxymethyl ethane, 2-ethyl-2-hydroxymethyl-1,3-propanediol, 1,2,6-hexanetriol, 1,2,3-hexanetriol, 1,2,4-butanetriol, 1,2,6-hexanetriol, 1,2,3-hexanetriol, 1,2,4-butanetriol or the like.

As the practical example of the organic solvent (51), such sugar alcohol as D-Threitol, Erythritol, Pentaerythritol, Pentitol, Hexitol can be used. In the above described Pentitol, Xylitol, Ribitol, and Arabitol are included. In the above described Hexitol, Mannitol, Sorbitol, Dulicitol, or the like is included. Furthermore, such saccharide as Glyceric aldehyde, Dioxy-acetone, threose, Erythrulose, Erythrose, Arabonose, Ribose, Ribulose, Xylose, Xylulose, Lyxose, Glucose, Fructose, Mannose, Idose, Sorbose, Gulose, Tagatose, Galactose, Allose, Altose, Lactose, Isomaltose, Gluco-heptose, Heptose, Maltotoriose, Lactulose, Torehalose can be used, however, those having high boiling point can be mixed with other organic solvent (S1) having low boiling point for use. Among the above described alcohol, polyalcohol having more than two hydroxyl groups within molecule is preferable, and ethylene glycol and glycerol are more preferable.

(b) Organic Solvent (SA)

The organic solvent (SA) is the chemical compound having the amide group (—CONH—), and in particular, those having high relative permittivity are preferable. As the organic solvent (SA), there are listed the followings: N-methylacetamide (191.3 at 32 degrees C.), N-methylformamide (182.4 at 20 degrees C.), N-methylpropaneamide (172.2 at 25 degrees C.), formamide (111.0 at 20 degrees C.), N,N-dimethylacetamide (37.78 at 25 degrees C.), 1,3-dimethyl-2-imidazolidinone (37.6 at 35 degrees C.), N,N-dimethylformamide (36.7 at 25 degrees C.), 1-methyl-2-pyrolidone (32.58 at 25 degrees C.), hexamethylphosphoric triamide (29.0 at 20 degrees C.), 2-pyrrolidinone, ε-caprolactam, and acetamide. In addition, the above described can be mixed for use. The number in the bracket following the name of the chemical compound having amide group represents the relative permittivity of each of the solvent at the measured temperature. Among them, such N-methylacetamide, N-methylformamide, formamide, acetamide as having the relative permittivity of more than 100 can be suitably used. Such as N-methylacetamide, which is solid at normal temperature, is mixed with the other solvent so that it becomes liquid at the process temperature, thus can be used.

(c) Organic Solvent (SB)

The organic solvent (SB) is the chemical compound having the boiling point from 20 to 100 degrees C. at normal pressure. With the boiling point being less than 20 degrees C. at normal pressure, when the particle dispersion liquid containing the organic solvent (SB) is stored at normal temperature, the constituent of the organic solvent (SB) is volatilized to likely vary the composition of the paste. In addition, with the boiling point being 100 and less than 100 degrees C. at normal pressure, the inter attractive force between the medium molecules is lowered due to the addition of the medium, thus it is expected that the effect to further improve the dispersibility of the fine particles is effectively performed.

As the organic solvent (SB), the followings can be exemplified: ether compound (SB1) expressed by a general form $R^1$—O—$R^2$ ($R^1,R^2$ is independently alkyl group, number of carbon atoms: 1 to 4), alcohol (SB2) expressed by a general form $R^3$—OH($R^3$ is alkyl group, number of carbon atoms: 1 to 4), ketone compound (SB3) expressed by a general form $R^4$—C(=O)—$R^5$ ($R^4,R^5$ is independently alkyl group, number of carbon atoms: 1 to 2), and amine compound (SB4) expressed by a general form $R^6$—(N—$R^7$)—$R^8$ ($R^6,R^7,R^8$ is independently alkyl group or hydrogen atom, number of carbon atoms: 0 to 2).

Hereunder, the above described organic solvent (SB) is exemplified. The number following the name of the compound represents the boiling point at normal temperature.

As the ether compound (SB1), the followings are exemplified: diethyl ether (35 degrees C.), methyl propyl ether (31 degrees C.), dipropyl ether (89 degrees C.), diisopropyl ether (68 degrees C.), methyl-t-butyl ether (55.3 degrees C.), t-amyl methyl ether (85 degrees C.), divinyl ether (28.5 degrees C.), ethyl vinyl ether (36 degrees C.), allyl ether (94 degrees C.) or the like.

As the alcohol (S32), the followings are exemplified: methanol (64.7 degrees C.), ethanol (78.0 degrees C.), 1-propanol (97.15 degrees C.), 2-propanol (82.4 degrees C.), 2-butanol (100 degrees C.), 2-methyl 2-propanol (83 degrees C.) or the like.

As the ketone compound (SBA the followings are exemplified: acetone (56.5 degrees C.), methyl ethyl ketone (79.5 degrees C.), diethyl ketone (100 degrees C.) or the like.

As the amine compound (S34), the followings are exemplified: triethylamine (89.7 degrees C.), diethylamine (55.5 degrees C.).

(2-3) Organic Binder (R)

The organic binder (R) functions to prevent the agglomeration of the metal fine particles (P) in the conductive paste, to adjust the viscosity of the conductive paste, and to maintain the shape of the conductive connecting member precursor.

It is preferable that the organic binder (R) comprises one or more than two kinds selected from the group consisting of cellulose resin binder, acetate resin binder, acrylic resin binder, urethane resin binder, polyvinilpyrroridone resin binder, polyamide resin binder, butyral resin binder, and terpene binder.

Practically it is preferable that the cellulose resin binder comprises one or more than two kinds selected from the group consisting of acetylcellulose, methyl cellulose, ethylcellulose, butylcellulose, and nitrocellulose; the acetate resin binder comprises one or more than two kinds selected from the group consisting of methyl glycol acetate, ethyl glycol acetate, butyl glycol acetate, ethyl diglycol acetate, and butyl diglycol acetate; the acrylic resin binder comprises one or more than two kinds selected from the group consisting of methyl methacrylate, ethyl methacrylate, and butylmethacrylate; the urethane resin binder comprises one or more than two kinds selected from the group consisting of 2,4-tolylenediisocyanate, and p-phenylene diisocyanate; the polyvinilpyrroridone resin binder comprises one or more than two kinds selected from the group consisting of polyvinil pyrolidone, and N-vinil pyrolidone; polyamide resin binder comprises one or more than two kinds selected from the group consisting of polyamide 6, polyamide 66, and polyamide 11; the butyral resin binder comprises polyvinil butyral; and the terpene binder comprises one or more than two kinds selected from the group consisting of pinene, cineol, limonene, and terpineol.

(3) Conductive Paste

The conductive paste contains the metal fine particles (P) having mean primary particle diameter from 10 to 500 nm and the organic solvent (S), or the conductive paste contains the metal fine particles (P) and the organic dispersion medium (D) comprising the organic solvent (S) and the organic binder (R). When the conductive paste is heating-treated, the vaporization of the organic solvent (S) or the vaporization of the organic solvent (S) as well as the thermal decomposition proceed so that the surface of the metal fine particles appear and the fine particles are bonded (sintered) each other on the surface, using the above described principle, thus functioning as the bonding member.

The mixing ratio (P/D) of the metal fine particles (P) and the organic dispersion medium (D) is preferably from 50 to 85 mass % for P and from 50 to 15 mass % for D (total mass % is 100 mass %) in the conductive paste. Incidentally, other metal fine particles, other organic dispersion medium or the like can be added to the conductive paste of the invention, as far as the effect of the invention is not damaged.

With the mixing ratio of the metal fine particles (P) being over 85 mass %, the viscosity of the paste becomes high, causing insufficient bonding between the surfaces of the metal fine particles (P) during the heating-treatment to lower the conductivity. On the other hand, with the mixing ratio of the metal fine particles (P) being less than 50 mass %, the viscosity of the paste becomes low so that it is difficult to maintain the shape of the conductive connecting member applied on the bonded face of the electrode terminal of the semiconductor device or the electrode terminal of the circuit board, in addition, likely causing the shrinkage during the heating-treatment, furthermore, likely delaying the speed of the vaporization of the organic dispersion medium (D) during the heating-treatment. From the above described point of view, the mixing ratio (P/D) of the metal fine particles (P) and the organic dispersion medium (D) is preferably from 50 to 85 mass % for P and from 50 to 15 mass % for D in the conductive paste, and the mixing ratio of (S/R) of the organic solvent (S) and the organic binder (R) is preferably from 80 to 100 mass % for S and from 20 to 0 mass % for R in the organic dispersion medium (a total of mass % is 100 mass %, respectively).

With the mixing ratio of the organic binder (R) in the organic dispersion medium (D) being over 20 mass %, the speed of the thermal decomposition of the organic binder (R) to be scattered becomes slow during the heating-treatment of the conductive connecting member precursor, furthermore, when the amount of the remaining carbon increases, the sintering is deteriorated to likely cause the crack, peeling or the like, thus not favorable.

If the metal fine particles (P) is uniformly dispersed with the use only of the organic solvent, by the selection of the organic solvent (S) so that the viscosity of the conductive paste is adjusted, and the shape of the conductive connecting member precursor is maintained, only the constituent of the organic solvent (S) can be used as the organic dispersion medium (D).

Such known additive as the antifrothing agent, dispersing agent, plasticizer, surfactant, thickener or the like can be added to the above described constituent in the conductive connecting member, as requested. When the conductive paste is prepared, the above described constituents can be mixed and then kneaded with the use of ball mill or the like.

(4) Preparation of the Conductive Connecting Member Precursor

The means, in which the conductive paste is applied on the electrode terminal of the semiconductor device or the like to prepare such conductive connecting member precursor as the conductive bump precursor, conductive die bonding portion or the like, is not particularly limited. For example, there are listed the followings: known screen-printing, and the method in which the opening portion is formed with the resist as described later, and the conductive paste is filled therein.

When the screen-printing is applied, the screen with the pattern film (resist) is placed on the electrode terminal of the semiconductor or the like, the conductive paste is mounted thereon, and the paste is slid by the squeegee, the conductive paste passes through the portion with no resist of the screen, and is transferred on the electrode terminal or the like to form the conductive connecting member precursor. As the method of forming the opening portion for filling the conductive paste, there are the photolithography method in which the pattern is formed on the photosensitive resin layer following the exposure-development process, and the method in which high energy beam such as laser beam, electron beam, ion beam or the like is irradiated on the insulating layer provided on the device to form the opening portion by means of the heating to melt or the ablation for cutting off the molecule bonding of the resin. Among those methods, the photolithography, or the method of forming the opening portion with the laser beam is favorable from the practical point of view.

[2-2] Step 2

The step 2 is the step of aligning with the other electrode terminal connected onto the conductive connecting member precursor. The alignment with the other electrode terminal means that a plurality of conductive connecting member precursors formed on the electrode terminal of the semiconductor device are aligned with the corresponding portions to be bonded as a pair with the above described electrode terminal so that after the heating-treatment, the electrode terminal of the semiconductor device and the electrode terminal of the circuit board are contacted so as to be electrically connected. As a practical example, the electrode of the semiconductor device is aligned with the connecting terminal portion of the substrate conveyed by the tape reel or the like with the use of the optical device or the like.

[2-3] Step 3

The step 3 is the step of heat-treating the conductive connecting member precursor at a temperature from 150 to 350 degrees C. to form a conductive connecting member comprising a porous body prepared by bonding the metal fine particles having mean primary particle diameter from 10 to 500 nm, a porosity thereof being from 5 to 35 volume %, and mean pore diameter being from 1 to 200 nm so as to bond both of the bonded surfaces.

(1) Heating-treatment

The conductive connecting member precursor formed on the electrode terminal of the semiconductor or the like and connected to the corresponding electrode terminal is heating-treated at the temperature from 150 to 350 degrees C. so that the electrode terminal of the semiconductor device or the like and the corresponding electrode terminal are electrically and mechanically connected. When the organic solvent (S) having relatively low boiling point is contained as the organic dispersion medium (D) in the conductive connecting member precursor, the drying process is arranged prior to the heating-treatment to enable to vaporize and remove the part of the organic solvent (S).

Since the metal fine particles having mean primary diameter from 10 to 500 nm are used as the metal fine particles (P), when the organic dispersion medium (D) is removed by means of the heating, the agglomeration at the lower temperature than the melting point of the bulk state metal and the bonding between the surfaces of the metal fine particles proceed so that the conductive connecting member of the metal porous body is prepared. When the organic solvent (S1) (or the organic solvent (SC)) is contained in the organic solvent (5), the organic solvent functions to reduce in the liquid state or gas state so that the oxidation of the metal fine particles is prevented and the sintering is accelerated.

(2) Conductive Connecting Member

Thus obtained metal porous body in the conductive connecting member such as conductive bump, conductive die bonding portion or the like has porosity from 5 to 35 volume %, and mean pore diameter is from 1 to 200 nm. The method of measuring the porosity, mean diameter of e metal fine particles, and mean pore diameter in the conductive connecting member is the same as that described in the first embodiment. Since the conductive connecting member of the invention comprises the metal porous body formed in such manner that the metal fine particles are surface-contacted each other to be bonded (sintered), it has appropriate elasticity and softness, in addition, the conductivity thereof is not damaged.

EXAMPLE

The present invention is more practically described with reference to the examples. However the present invention is not limited to the examples. The method of measuring the mean particle diameter of the metal fine particles, the mean pore diameter and the porosity of the conductive connecting member are described below.

(1) Method of Measuring the Mean Particle Diameter of the Metal Fine Particles

Each of the cross section of the 10 particles selected at random was observed with the scanning type electron microscope (SEM), and the diameters of the maximum inscribed circle in the cross section in two dimensions were measured to calculate the mean value. Incidentally, when two-dimensional shape was about circle in the cross sectional picture of the electron microscope, the diameters of the circles were measured, in the same manner, the short side for about ellipse, the length of one side for quadrate, and the short side for rectangle were measured.

(2) Method of Measuring Mean Pore Diameter

The cross sectional shapes of 10 to 20 pores selected at random were observed and measured with the scanning type electron microscope (SEM), and calculated mean value thereof.

(3) Method of Measuring Porosity

The electron microscope picture was taken with the transmission type electron microscope (TEM), and the cross sectional image was analyzed to decide the porosity. In case that the pore size was smaller than 100 nm, it was sliced into thin section by the ultramicrotome process or ion milling process, and observed with the use of the transmission type electron microscope (TEM) to measure same.

Example 1

The conductive paste was prepared, using the copper fine particles having mean primary particle diameter of 150 nm and the organic dispersion medium comprising the organic solvent and the organic binder. Thus prepared conductive paste was applied on the conductive substrate to form the conductive bump precursor. Then the lead of the electronic component was mounted on thus prepared conductive bump precursor, and then heating-treated (sintered) to form the conductive bump bonded body. The heat resist cycle test was implemented for the conductive bump bonded body.

(1) Preparation of the Conductive Paste 70 mass % of the Cu fine particles having mean primary particle diameter of 150 nm prepared by the electroless reduction of the Cu ion in the aqueous solution, and 30 mass % of the organic dispersion medium comprising 95 mass % of glycerol as the organic solvent (which corresponds to the organic solvent (S1) of the invention) and 5 mass % of ethyl cellulose (mean molecular weight: 1000,000) as the organic binder were kneaded to prepare the conductive paste.

(2) Forming the Bump Precursor on the Substrate and Forming the Conductive Bump Bonded Body by Sintering the Precursor The conductive paste was screen-printed on the four pads each having 100 μmΦ (size)×9 μm (thickness) arranged on the ceramic substrate (located at the corner of the quadrate with 4 mm side) so that each of the formed conductive paste was 70 μmΦ (size)×70 μm (thickness), thus the conductive bump precursor was formed.

The lead of the chip-type electronic component was mounted on the bump precursor, and then was heating-treated under an inert gas atmosphere at the temperature of 200 degrees C. for 20 minutes to be sintered, thus the conductive bump bonded body comprising metal porous body was formed.

(3) Evaluation of the Conductive Bump (i) Observation of the Pore

The circuit board and the chip type electronic component connected to the bump were embedded in the epoxy resin. The electronic component and circuit board together with the resin were grinded to expose the cross section of the bump portion. When the cross section of the bump was observed with the scanning type electron microscope, the porosity was 5 volume %, and the mean diameter of the pore was 10 nm, as shown in Table 1.

(ii) Heat-resistant Cycle Test

The circuit board bonded with the component by the conductive bump (i.e., conductive bump bonded body) was subjected to the heat-resistant test comprising the cold-hot cycle in which the following four temperature variation as one cycle were repeated 1000 times in that order: −55 degrees C. for 30 minutes, 25 degrees C. for 5 minutes, 125 degrees C. for 30 minutes, and 25 degrees C. for 5 minutes.

The evaluation standard was applied, in which it was evaluated as the defect, when the resistance in the connecting portion after the cold-hot cycle test became at least 2 times of the initial electrical resistance. As a result, no defect occurs even though 10 samples were measured. The constituent and composition of the conductive paste, and the evaluation results of the conductive bump were shown as a whole in Table 1.

Examples 2 and 3

In the Example 2, the bump precursor was formed and then heating-treated to form the conductive bump bonded body in the same manner as Example 1 except that the mixed organic solvent comprising 40 volume % of glycerol, 55 volume % of N-methylacetamide, and 5 volume % of triethylamine (corresponding to the organic solvent (S2) of the invention) was used as the organic solvent in place of glycerol itself.

In the Example 3, the bump precursor was formed and then heating-treated to form the conductive bump bonded body in the same manner as Example 1 except that the mixed organic solvent comprising 45 volume % of glycerol, and 55 volume % of N-methylacetamide (corresponding to the organic solvent (S3) of the invention) was used as the organic solvent in place of glycerol itself.

The conductive bump bonded bodies obtained in Examples 2 and 3 were subjected to the same heat-resistant test as described in Example 1. The constituent and composition of the conductive paste, and the evaluation results of the conductive bump in Examples 2 and 3 are shown as a whole in Table 1.

Comparative Example 1

The bump precursor was formed and then heating-treated to form the conductive bump bonded body with the component in the same manner as Example 1 except that the copper fine particles having mean primary particle diameter of 1.5 μm was used as the metal fine particles. Then, the conductive bump bonded bodies obtained in Comparative example 1 were subjected to the same heat-resistant test as described in Example 1. The constituent and composition of the conductive paste, and the evaluation results of the conductive bump in Comparative example 1 were shown as a whole in Table 1.

TABLE 1

|  |  |  | Example 1 | Example 2 | Example 3 | Comparative example 1 |
|---|---|---|---|---|---|---|
| Conductive paste | Mean primary particle diameter of metal fine particles | — | 150 nm | 150 nm | 150 nm | 1.5 μm |
|  | Metal fine particles/organic dispersion medium | (mass %) | 70/30 | 70/30 | 70/30 | 70/30 |
|  | Organic solvent/organic binder | (mass %) | 95/5 | 95/5 | 95/5 | 95/5 |
|  | Organic solvent — glycerol | (volume %) | 100 | 40 | 45 | 100 |
|  | N-methylacetamine | (volume %) | 0 | 55 | 55 | 0 |
|  | Triethylamine | (volume %) | 0 | 5 | 0 | 0 |
| Conductive bump | Porosity | (volume %) | 5 | 7 | 6 | 9 |
|  | Mean pore diameter | — | 10 nm | 18 nm | 15 nm | 1 μm |
|  | Cold-hot cycle test* | — | 0/10 | 0/10 | 0/10 | 8/10 |

*A number of the samples are shown, in which the resistance of the connecting portion after the cold-hot cycle test becomes two times than that of before test.

Example 4

The bump precursor was formed and then heating-treated to form the conductive bump bonded body with the component in the same manner as Example 1 except that 60 mass % of the Cu fine particles having mean primary particle diameter of 150 nm prepared by the electroless reduction of the Cu ion in the aqueous solution, and 40 mass % of the organic dispersion medium comprising 95 mass % of glycerol as the organic solvent (which corresponds to the organic solvent (S1) of the invention) and 5 mass % of ethyl cellulose (mean molecular weight: 1000,000) as the organic binder were kneaded to prepare the conductive paste. Then, the conductive bump bonded bodies obtained in Example 4 were subjected to the same heat-resistant test as described in Example 1. The constituent and composition of the conductive paste, and the evaluation results of the conductive bump in Example 4 were shown as a whole in Table 2.

Examples 5 and 6

In the Example 5, the bump precursor was formed and then heating-treated to form the conductive bump bonded body in the same manner as Example 1 except that the mixed organic solvent comprising 40 volume % of glycerol, 55 volume % of N-methylacetamide, and 5 volume % of triethylamine (corresponding to the organic solvent (S2) of the invention) was used as the organic solvent in place of glycerol itself.

In the Example 6, the bump precursor was formed and then heating-treated to form the conductive bump bonded body in the same manner as Example 1 except that the mixed organic solvent comprising 45 volume % of glycerol, and 55 volume % of N-methylacetamide (corresponding to the organic solvent (S3) of the invention) was used as the organic solvent in place of glycerol itself.

The conductive bump bonded bodies obtained in Examples 5 and 6 were subjected to the same heat-resistant test as described in Example 1. The constituent and composition of the conductive paste, and the evaluation results of the conductive bump in Examples 5 and 6 were shown as a whole in Table 2.

Comparative Example 2

The bump precursor was formed and then heating-treated to form the conductive bump bonded body with the component in the same manner as Example 4 except that the copper fine particles (prepared by the electroless reduction of the Cu ion in the aqueous solution) having mean primary particle diameter of 1.5 μm was used as the metal fine particles. Then, the conductive bump bonded body obtained in Comparative example 2 was subjected to the same heat-resistant test as described in Example 1. The constituent and composition of the conductive paste, and the evaluation results of the conductive bump in Comparative example 2 were shown as a whole in Table 2.

reduction of the Cu ion in the aqueous solution, and 30 mass % of the organic dispersion medium comprising 95 mass % of glycerol as the organic solvent (which corresponds to the organic solvent (S1) of the invention) and 5 mass % of ethyl cellulose (mean molecular weight: 1,000,000) as the organic binder were kneaded to prepare the conductive pastes.

(2) Bonding of the Electronic Component

The aluminum substrates were used (which were made by DENKI KAGAKU KOGYO Co. Ltd, Product name: HITT Plate K-1®, the insulating layers having a thickness of 0.075 mm were formed on the aluminum thick plates having a thickness of 1.5 mm, further, the copper foils for a circuit were laminated on the insulating layer). Then, the pads were prepared by etching the copper foil in which 5.5×5.5 mm area were patterned. The conductive pastes were used to form the metal mask of 5.5×5.5 mm pattern, and then the silicon chips (spattering treatment: Ti/Au=35/150 nm) having the size of 4×4×0.35 mm (thickness) were placed in order for the spattering-treating face and the narrow slip for the heat bonding to be contacted. The silicon chips were mounted on the aluminum substrates by means of flip-chip bonder, under the condition in which the pressure of 5 Mpa was applied onto the surface of the chip, and heated for 10 minutes at the temperature of 300 degrees C. respectively.

(3) Evaluation of the Connected Portion (i) Observation of the Pore

The connected aluminum substrate and the silicon chip were embedded in the epoxy resin. The connected bodies

TABLE 2

| | | | Example 4 | Example 5 | Example 6 | Comparative example 2 |
|---|---|---|---|---|---|---|
| Conductive paste | Mean primary particle diameter of metal fine particles | — | 150 nm | 150 nm | 150 nm | 1.5 μm |
| | Metal fine particles/organic dispersion medium | (mass %) | 60/40 | 60/40 | 60/40 | 60/40 |
| | Organic solvent/organic binder | (mass %) | 95/5 | 95/5 | 95/5 | 95/5 |
| | Organic solvent | glycerol (volume %) | 100 | 40 | 45 | 100 |
| | | N-methylacetamine (volume %) | 0 | 55 | 55 | 0 |
| | | Triethylamine (volume %) | 0 | 5 | 0 | 0 |
| Conductive bump | Porosity | (volume %) | 7 | 9 | 8 | 12 |
| | Mean pore diameter | — | 15 nm | 30 nm | 20 nm | 2 μm |
| | Cold-hot cycle test* | — | 0/10 | 0/10 | 0/10 | 10/10 |

*A number of the samples are shown, in which the resistance of the connecting portion after the cold-hot cycle test becomes two times than that of before test.

Examples 7, 8 and 9

The conductive pastes used in Examples 7, 8 and 9 were prepared, using the mixed copper fine particles having mean primary particle diameter of 150 nm with the organic solvent, or the mixed copper fine particles having mean primary particle diameter of 150 nm with the organic solvent and the organic binder. Thus prepared conductive pastes were applied on each conductive substrate to form the angular die bonding member. Then the leads of the electronic component were mounted on thus prepared die bonding member, and then heating-treated (sintered) to form the bonded bodies respectively. The porosity and the mean pore diameter in each bonded bodies were measured, and the heat-resist cycle tests were implemented for each bonded bodies.

(1) Preparation of the Conductive Paste 70 mass % of the Cu fine particles having mean primary particle diameter of 150 nm prepared by the electroless together with the resin were grinded to expose the cross section of the connected portion. When the cross section of the connected portion were observed with the scanning type electron microscope, the porosity is 5 volume %, and the mean diameter of the pore is 50 nm.

(ii) Heat-resistant Cycle Test

The members with the aluminum substrates and silicon chips connected were subjected to the heat-resistant test comprising the cold-hot cycle in which the following four temperature variation as one cycle are repeated 1000 times in that order: −55 degrees C. for 30 minutes, 25 degrees C. for 5 minutes, 125 degrees C. for 30 minutes, and 25 degrees C. for 5 minutes respectively.

After the cold-hot cycle test, the connected portions were observed with the ultrasonic microscope to check if there were the peeled portions or not. In the observation with the ultrasonic microscope, the high reflected signal of the ultrasonic wave were observed in the peeled portion. Almost no high reflected signal of the ultrasonic wave were observed in the connected portion across the whole connecting face, and no sample was found with the generation of the peeling. The constituent and composition of the conductive paste, and the evaluation results were shown as a whole in Table 3.

Comparative Examples 3

The conductive paste was applied on the conductive substrate to form the angular die bonding member, then the lead of the electronic component was mounted on thus prepared die bonding member, and then heating-treated (sintered) to form the bonded body in the same manner as Example 7 except that the Cu fine particles having mean primary particle diameter of 1.5 μm prepared by the electroless reduction of the Cu ion in the aqueous solution was used as the metal fine particles. The porosity and the mean pore diameter in the bonded body was measured, and the heat-resist cycle test was implemented for the bonded body in the same manner as Example 1. The constituent and composition of the conductive paste, and the evaluation results were shown as a whole in Table 3.

TABLE 3

|  |  |  | Example 7 | Example 8 | Example 9 | Comparative example 3 |
|---|---|---|---|---|---|---|
| Conductive paste | Mean primary particle diameter of metal fine particles | — | 150 nm | 150 nm | 150 nm | 1.5 μm |
|  | Metal fine particles/organic dispersion medium | (mass %) | 70/30 | 70/30 | 70/30 | 70/30 |
|  | Organic solvent/organic binder | (mass %) | 100/0 | 95/5 | 95/5 | 95/5 |
|  | Organic solvent  glycerol | (volume %) | 100 | 40 | 45 | 100 |
|  | N-methylacetamine | (volume %) | 0 | 55 | 55 | 0 |
|  | Triethylamine | (volume %) | 0 | 5 | 0 | 0 |
| Conductive bump | Porosity | (volume %) | 5 | 7 | 6 | 9 |
|  | Mean pore diameter | — | 50 nm | 75 nm | 120 nm | 3 μm |
|  | Cold-hot cycle test* | — | 0/10 | 0/10 | 0/10 | 8/10 |

*A number of the samples are shown, in which the resistance of the connecting portion after the cold-hot cycle test becomes two times than that of before test.

What is claimed is:

1. A conductive connecting member formed on a bonded face of an electrode terminal of a semiconductor or an electrode terminal of a circuit board, said conductive connecting member comprising:
    a porous body formed of a conductive paste, said conductive paste containing metal fine particles (P) having a mean primary particle diameter of 10 to 500 nm and an organic solvent (S), or the metal fine particles (P) and an organic dispersion medium (D) comprising the organic solvent (S) and an organic binder (R),
    wherein said metal fine particles (P) are formed of copper,
    said organic solvent (S) contains at least one of an alcohol and a polyalcohol having a boiling point of at least 100 degrees C. at a normal pressure and one or more than two hydroxyl groups within a molecule,
    said conductive paste is heated so that the metal fine particles (P) are bonded, and
    said porous body has a porosity of 6 to 9 volume % and a mean pore diameter of 15 to 120 nm.

2. The conductive connecting member according to claim 1, wherein said conductive connecting member is a conductive bump to connect semiconductor devices.

3. The conductive connecting member according to claim 1, wherein said conductive connecting member is a conductive die bonding portion to connect a semiconductor device and a conductive substrate.

4. The conductive connecting member according to claim 1, further comprising a cover layer formed of a metal material different from that of the metal fine particles (P), said cover layer being formed on the metal fine particles (P).

5. A method of manufacturing a conductive connecting member comprising:
    a step of mounting a conductive paste containing metal fine particles (P) having a mean primary particle diameter of 10 to 500 nm and an organic solvent (S), or the metal fine particles (P) and an organic dispersion medium (D) comprising the organic solvent (S) and an organic binder (R) on a first electrode terminal or a first conductive substrate to form a conductive connecting member precursor;
    a step of placing a second electrode terminal or a second conductive substrate on the conductive connecting member precursor; and
    a step of heat-treating the first electrode terminal or the first conductive substrate, and the conductive connecting member precursor at a temperature of 150 to 350 degrees C. to form the conductive connecting member comprising a porous body containing the metal fine particles,
    wherein said metal fine particles (P) are formed of copper,
    said porous body has a porosity of 6 to 9 volume % and a mean pore diameter of 15 to 120 nm,
    said metal fine particles (P) have a mass % of 50 to 85% relative to a total mass of the conductive paste,
    said organic dispersion medium (D) has a mass % of 15 to 50% relative to the total mass of the conductive paste,
    said organic solvent (S) has a mass % of 80 to 100% relative to a total mass of the organic dispersion medium, and
    said organic binder (R) has a mass % of 0 to 20% relative to the total mass of the organic dispersion medium.

6. The method of manufacturing the conductive connecting member according to claim 5, wherein in the step of mounting the conductive paste, said metal fine particles (P) includes first metal fine particles (P1) formed of copper, and second metal fine particles (P2) formed of one or more kinds selected from magnesium, aluminum, zinc, gallium, indium, tin, antimony, lead, bismuth, titanium, manganese, and germanium said metal fine particles (P1) have a mass % of 90 to 100% relative to a total mass of the metal fine particles (P1) and the metal fine particles (P2), and said metal fine particles (P2) have a mass % of 0 to 10% relative to the total mass of the metal fine particles (P1) and the metal fine particles (P2).

7. The method of manufacturing the conductive connecting member according to claim 6, wherein said second metal fine particles (P2) mixed with the first metal fine particles (P1) form an alloy, or form a cover layer of the first metal fine particles (P1).

8. The method of manufacturing the conductive connecting member according to claim 5, wherein in the step of mounting the conductive paste, said organic solvent (S) includes one of:

an organic solvent (S1) formed of an alcohol and/or a polyalcohol having a boiling point of at least 100 degrees C. at a normal pressure and one or more hydroxyl groups within a molecule thereof, a first mixture of an organic solvent (SA) having an amide group, an organic solvent (SB) having a boiling point of 20 to 100 degrees C. at a normal pressure, and an organic solvent (SC) formed of an alcohol and/or a polyalcohol having a boiling point of at least 100 degrees C. at a normal pressure and one or more hydroxyl groups within a molecule thereof, said organic solvent (SA) having a volume % of 5 to 90% relative to a total volume of the first mixture, said organic solvent (SB) having a volume % of 5 to 45% relative to the total volume of the first mixture, said organic solvent (SC) having a volume % of 5 to 90% relative to a total volume of the first mixture, and a second mixture of the organic solvent (SA) and the organic solvent (SC), said organic solvent (SA) having a volume % of 5 to 95% relative to a total volume of the second mixture, said organic solvent (SC) having a volume % of 5 to 95% relative to a total volume of the second mixture.

9. The method of manufacturing the conductive connecting member according to claim 8, wherein said organic solvent (S1) or said organic solvent (SC) is formed of at least one selected from the group consisting of ethylene glycol, diethylene glycol, 1,2-propanediol, 1,3-propanediol, 1,2-butandiol, 1,3-butanediol, 1,4-butanediol, 2-butene-1,4-diol, 2,3-butanediol, pentanediol, hexanediol, octanediol, glycerol, 1,1,1-tris hydroxymethyl ethane, 2-ethyl-2-hydroxymethyl-1,3-propanediol, 1,2,6-hexanetriol, 1,2,3-hexanetriol, 1,2,4-butanetriol, 1,2,6-hexanetriol, 1,2,3-hexanetriol, 1,2,4-butanetriol, threitol, erythritol, pentaerythritol, pentitol, and hexitol.

10. The method of manufacturing the conductive connecting member according to claim 8, wherein said organic solvent (SA) is formed of at least one selected from the group consisting of N-methylacetamide, N-methylformamide, N-methylpropaneamide, formamide, N,N-dimethylacetamide, 1,3-dimethyl-2-imidazolidinone, N,N-dimethylformamide, 1-methyl-2-pyrolidone, hexamethylphosphoric triamide, 2-pyrrolidinone, ε-caprolactam, and acetamide.

11. The method of manufacturing the conductive connecting member according to claim 8, wherein said organic solvent (SB) is formed of at least one selected from the group consisting of an ether compound expressed by a general form $R^1$—O—$R^2$ in which $R^1$ and $R^2$ are alkyl groups having carbon atoms from 1 to 4, an alcohol expressed by a general form $R^3$—OH in which $R^3$ is an alkyl group having carbon atoms from 1 to 4, a ketone compound expressed by a general form $R^4$—C(=O)—$R^5$ in which $R^4$ and $R^5$ are alkyl groups having carbon atoms from 1 to 2, and an amine compound expressed by a general form $R^6$—(N—$R^7$)—$R^8$ in which $R^6$, $R^7$ and $R^8$ are hydrogen atoms or alkyl groups having carbon atoms from 0 to 2.

12. The method of manufacturing the conductive connecting member according to claim 8, wherein said organic solvent (SB) is formed of one of:

an ether compound formed of at least one selected from the group consisting of diethyl ether, methyl propyl ether, dipropyl ether, diisopropyl ether, methyl-t-butyl ether, t-amyl methyl ether, divinyl ether, ethyl vinyl ether, and allyl ether;

an alcohol formed of at least one selected from the group consisting of methanol, ethanol, 1-propanol, 2-propanol, 2-butanol, and 2-methyl 2-propanol;

a ketone compound formed of at least one selected from the group consisting of acetone, methyl ethyl ketone, and diethyl ketone; and an amine compound formed of at least one selected from the group consisting of triethylamine and diethylamine.

13. The method of manufacturing the conductive connecting member according to claim 5, wherein said organic binder (R) is formed of at least one selected from the group consisting of a cellulose resin binder, an acetate resin binder, an acrylic resin binder, a urethane resin binder, a polyvinilpyrroridone resin binder, a polyamide resin binder, a butyral resin binder, and a terpene binder.

14. The method of manufacturing the conductive connecting member according to claim 13, wherein said cellulose resin binder is formed of at least one selected from the group consisting of acetylcellulose, methyl cellulose, ethylcellulose, butylcellulose, and nitrocellulose, said acetate resin binder is formed of at least one selected from the group consisting of methyl glycol acetate, ethyl glycol acetate, butyl glycol acetate, ethyl diglycol acetate, and butyl diglycol acetate; the acrylic resin binder comprises one or more than two kinds selected from the group consisting of methyl methacrylate, ethyl methacrylate, and butylmethacrylate, said urethane resin binder is formed of at least one selected from the group consisting of 2,4-tolylenediisocyanate and p-phenylene diisocyanate, said polyvinilpyrroridone resin binder is formed of at least one selected from the group consisting of polyvinil pyrolidone and N-vinil pyrolidone, said polyamide resin binder is formed of at least one selected from the group consisting of polyamide 6, polyamide 66, and polyamide 11, said butyral resin binder is formed of polyvinil butyral, and said terpene binder is formed of at least one selected from the group consisting of pinene, cineol, limonene, and terpineol.

15. The method of manufacturing the conductive connecting member according to claim 5, further comprising a step of preparing the conductive paste through mixing the metal fine particles (P) and the organic dispersion medium (D) at a specific ratio so that the porous body has a porosity of 6 to 9 volume %.

* * * * *